United States Patent [19]

Henschen et al.

[11] Patent Number: 5,103,071
[45] Date of Patent: Apr. 7, 1992

[54] SURFACE MOUNT TECHNOLOGY BREAKAWAY SELF REGULATING TEMPERATURE HEATER

[75] Inventors: Homer E. Henschen, Carlisle; Michael J. McKee, New Cumberland; Joseph M. Pawlikowski, Lancaster, all of Pa.

[73] Assignee: AMP Incorporated, Harrisburg, Pa.

[21] Appl. No.: 277,362

[22] Filed: Nov. 29, 1988

[51] Int. Cl.⁵ .................................... B23K 1/00
[52] U.S. Cl. ............................ 219/85.22; 219/85.18
[58] Field of Search ............... 219/209, 85.22, 85.18; 228/180.1, 180.2

[56] References Cited

U.S. PATENT DOCUMENTS

| | | | |
|---|---|---|---|
| 4,256,945 | 3/1981 | Carter | 219/10.75 |
| 4,354,629 | 10/1982 | Grassauer | 228/56 |
| 4,484,704 | 11/1984 | Grassauer | 228/180 |
| 4,583,807 | 4/1986 | Kaufman | 339/125 |
| 4,623,401 | 11/1986 | Derbyshire | 148/13 |
| 4,626,767 | 12/1986 | Clappier | 323/280 |
| 4,629,278 | 12/1986 | Norton | 339/134 |
| 4,645,287 | 2/1987 | Olsson | 339/125 |
| 4,659,912 | 4/1987 | Derbyshire | 219/535 |
| 4,693,528 | 9/1987 | Asick | 439/83 |
| 4,695,713 | 9/1987 | Krumme | 219/553 |
| 4,701,587 | 10/1987 | Carter | 219/10.75 |
| 4,717,814 | 1/1988 | Krumme | 219/553 |
| 4,745,264 | 5/1988 | Carter | 219/553 |
| 4,788,404 | 11/1988 | Kent | 219/209 |
| 4,789,767 | 12/1988 | Doljack | 219/9.5 |

FOREIGN PATENT DOCUMENTS

| | | |
|---|---|---|
| 0158434 | 10/1985 | European Pat. Off. . |
| 0198697 | 10/1986 | European Pat. Off. . |
| 0206620 | 12/1986 | European Pat. Off. . |
| 0241597 | 10/1987 | European Pat. Off. ........... 43/2 |
| 0250094 | 12/1987 | European Pat. Off. . |

OTHER PUBLICATIONS

Standard Search Report, 9/19/89.

Primary Examiner—Clifford C. Shaw
Attorney, Agent, or Firm—David L. Smith

[57] ABSTRACT

Soldering of surface mount connector terminals to contact pads on a circuit board is facilitated by configuring the terminals and their solder tails as spaced integrally-formed projections of a selectively actuable heater. Thermal energy developed in the heater is conducted along the projections to the solder tails to melt fusible conductive material (e.g., solder, at the connection sites). After cooling, the projections are severed from the heater. The terminals, which are formed at the distal ends of the projections, are typically supplied partially inserted in respective terminal-receiving passages of the connector housing. After the soldering operation, the terminals are fully inserted into the passages. The heater is preferably a self-regulating heater in the form of a copper substrate having a skin layer of magnetically permeable, high resistance material. An alternating current of constant amplitude and high frequency is passed through the heater and concentrated in the skin layer at temperatures below the Curie temperature of the skin layer material. At higher temperatures the current is distributed through the lower resistance substrate to limit further heating. During the time interval required for the surface layer to reach its Curie temperature, the resistive power dissipation creates thermal energy that is conducted to the solder tails.

20 Claims, 2 Drawing Sheets

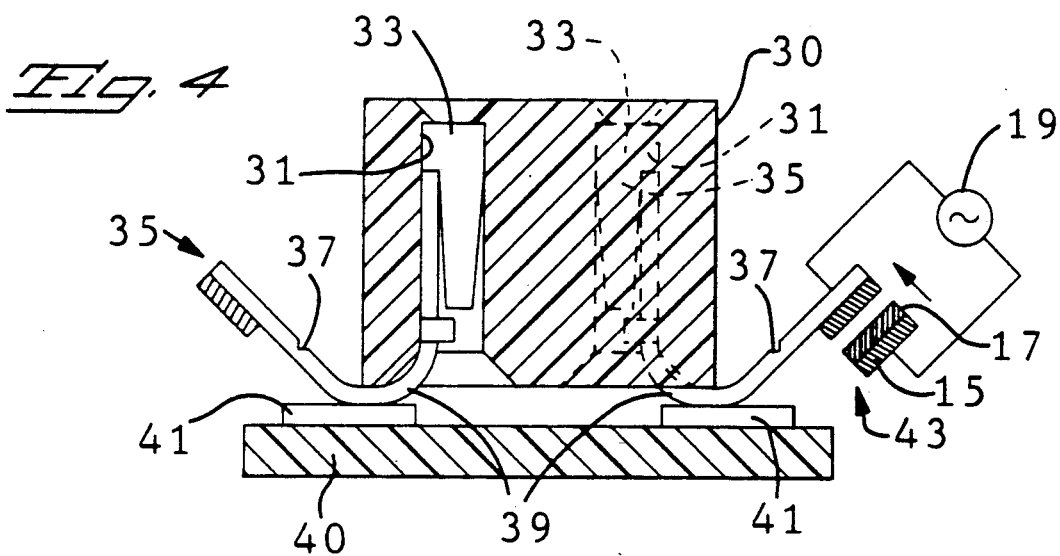
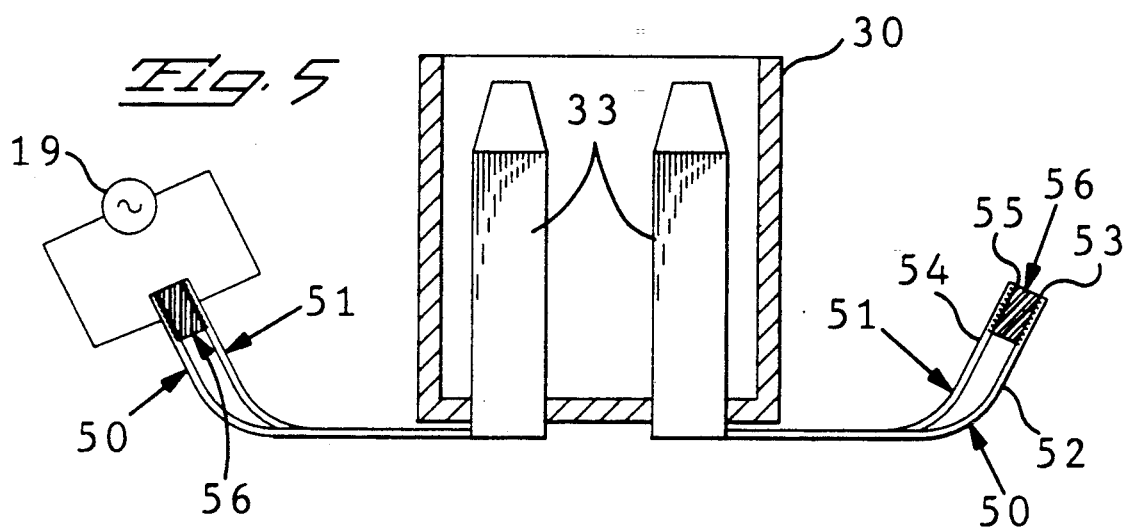
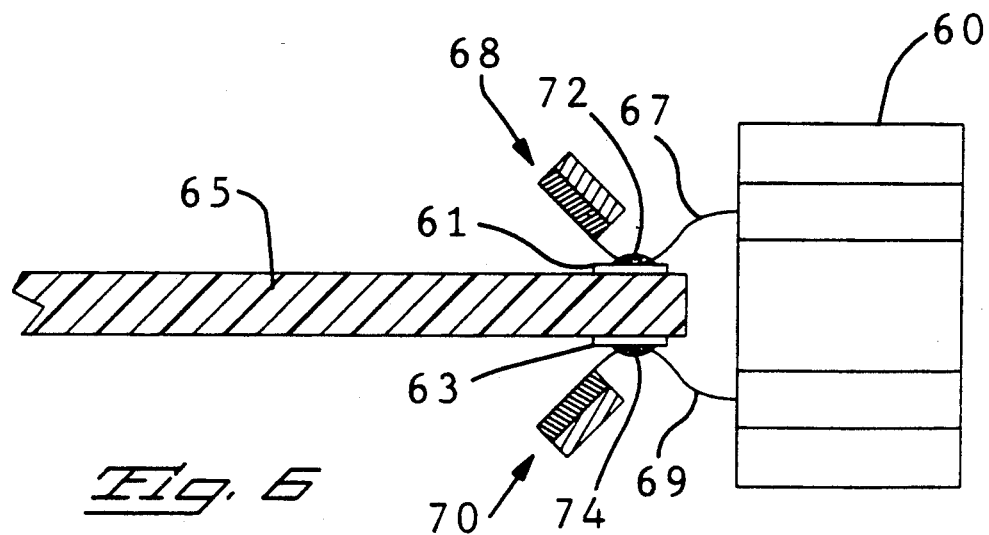

SURFACE MOUNT TECHNOLOGY BREAKAWAY SELF REGULATING TEMPERATURE HEATER

BACKGROUND OF THE INVENTION

The present invention relates to an improved method and apparatus for soldering individual terminals of a surface mount connector to respective contact pads disposed on a surface of a printed circuit board. Although the description set forth below specifies solder as the joining material, it is to be understood that any fusible electrically conductive material, such as doped conductive plastic material, may be employed.

Connectors having terminals with solder tails extending therefrom for reception in plated through holes of a printed circuit board are well-known. Relatively recently, in the interests of facilitating automated contact placement and economy of circuit board manufacture, surface mount connectors have been developed with terminals having solder tails formed for disposition against respective plated contact pads on the surface of the board. The terminals are typically fixed in the connector housing, and the tails are formed to sufficient length to assure compliance with the pads regardless of any tendency of the board to warp. Typically, each solder tail is individually manually soldered to a respective contact pad by any of a variety of known techniques. The repetitive soldering operations are both time consuming and costly.

There have been a number of prior art attempts to automatically solder multiple conductors, such as solder tails of a surface mount connector, to respective contact pads on a printed circuit board. In this regard reference is made to U.S. Pat. No. 4,484,704 (Grassauer et al) and the prior art described therein. In the Grassauer patent and other prior art soldering procedures for forming multiple solder joints simultaneously, a soldering tool is employed to deliver the necessary thermal energy over a large continuous area spanning all of the connection sites. Upon energization, the soldering tool heats up until it overshoots a control temperature before settling down to that temperature. The control temperature is typically chosen somewhat above the ideal soldering temperature in order to compensate for less than ideal thermal energy transfer. This approach to thermal energy delivery has a number of disadvantages. One such disadvantage is damage to components resulting from overheating. For example, the thermal overshoot inherent in the heating tool can damage components disposed between the connection sites within the area heated by the tool. In some cases the overshoot may cause damage to the polymeric materials, insulating materials and adhesives at the connection site. It is tempting to suggest that the operator of the soldering tool might avoid the thermal overshoot by either removing the tool before the overshoot occurs or delaying application of the tool until after the overshoot occurs. This is impractical for a number of reasons. First, there is no evident indication as to when the thermal overshoot occurs. Second, although the tool warm-up time is relatively long, the time interval during which the tool temperature is sufficient to melt solder, but prior to overshoot, is too short to reliably complete the soldering operation. Further, where the tool is also employed to apply pressure to the connection site, the power must be turned off after the solder melts while pressure is maintained on the tool until the solder solidifies. The tool must be re-energized to effect the next soldering cycle. These repeated on-off cycles change the starting temperature for the transient overshoot in each cycle, thereby making it virtually impossible to determine when the tool attains the final control temperature.

Another problem associated with prior art techniques for simultaneously joining multiple solder tails of a surface mount connector to respective contact pads of a printed circuit board relates to positional alignment of the components during soldering. It is not only necessary for the multiple solder tails to be simultaneously aligned with respective multiple contact pads on the printed circuit board surface; in addition, the solder tails and contact pads must also be simultaneously aligned with multiple respective sections of the solder delivery unit. The resulting alignment procedure is often unwieldy at best.

It is desirable, therefore, to provide a method and apparatus for simultaneously joining multiple solder tails of an electrical surface mount connector to multiple respective contact pads of a printed circuit board surface without requiring a third component to be aligned at each connection site. In addition, it is desirable that the thermal energy required to melt the solder be available virtually instantaneously after energization of the heater, and that the heater be arranged to provide no more thermal energy than is required to melt the solder employed for the various connection sites. Finally, it is desirable that the apparatus have relatively low mass in order that it may cool down quickly after a soldering operation.

The present invention makes use of a relatively new automatic self-regulating heater technology disclosed in U.S. Pat. Nos. 4,256,945 (Carter et al), 4,623,401 (Derbyshire et al), 4,659,912 (Derbyshire), 4,695,713 (Krumme), 4,701,587 (Carter et al), 4,717,814 (Krumme) and 4,745,264 (Carter). The disclosures in these patents are expressly incorporated herein by reference. A heater constructed in accordance with this technology, hereinafter referred to as a self-regulating heater, employs a substrate of copper, copper alloy, or other material of low electrical resistivity, negligible magnetic permeability and high thermal conductivity. A thin surface layer of thermally-conductive magnetic material is deposited on all or part of one surface of the substrate, the surface layer material typically being an iron, nickel or nickel-iron alloy, or the like, having a much higher electrical resistance and magnetic permeability than the substrate material. The thickness of the surface layer is approximately one skin depth, based on the frequency of the energizing current and the resistance and permeability of the surface layer. A constant amplitude, high frequency alternating energizing current is passed through the heater and, as a result of the skin effect phenomenon, is initially concentrated in one skin depth corresponding to the thickness of the magnetic material. When the temperature at any point along the heater reaches the Curie temperature of the magnetic material, the magnetic permeability of the magnetic material at that point decreases dramatically, thereby significantly increasing the skin depth so that the current density profile expands into the non-magnetic substrate of low resistivity. The overall result is a lower resistance and lesser heat dissipation. If thermal sinks or loads are placed in contact with the heater at different locations along the heater length, thermal energy is transferred to the loads at those locations with the result that the temperature of the magnetic material does not rise to the Curie temperature as quickly as those locations as it does in the non-loaded locations. The constant amplitude current remains concentrated in the higher resistance surface layer at the loaded locations which dissipate considerably more resistive heating energy than is dissipated in the non-load locations where the current is distributed in the low resistance substrate.

SUMMARY OF THE INVENTION

In accordance with the present invention a heater is preferably, but not necessarily, a self-regulating heater and has multiple connector terminals formed integrally therewith and projecting therefrom. The terminals include solder tail portions and provide respective thermally-conductive paths from the heater body to each connection site. Each terminal projecting from the heater body is inserted into a respective terminal-receiving passage in an electrical connector housing. To effect a soldering operation the connector housing is positioned to align the solder tails with respective contact pads on a printed circuit board. A preselected amount of solder or other fusible electrically-conductive material is disposed at each connection site (e.g., typically pre-deposited on the contact pads) and the requisite constant amplitude alternating current is passed through the heater body. After the soldering operation is completed the terminals are severed from the heater body, most typically along appropriately provided score or perforation lines. Importantly, only two components, namely the solder tail and the contact pad, must be aligned at each connection site, thereby greatly facilitating the relative positioning of the connector housing and printed circuit board prior to the soldering operation. In addition, thermal energy is applied almost instantaneously and only at the connection sites rather than at other locations on the connector and printed circuit board where the soldering temperature can cause damage to components.

BRIEF DESCRIPTION OF THE DRAWINGS

Specific embodiments of the present invention as illustrated in the accompanying drawings wherein like reference numerals in the various Figures are utilized to designate like components, and wherein:

FIG. 4 is a view in transverse section of a surface mount connector and heater assembly, such as illustrated in FIG. 3, disposed on a circuit board in accordance with the principles of the present invention;

FIG. 5 is a view in transverse section of an alternative embodiment of the surface mount connector and heater assembly of the present invention; and FIG. 6 is a view in transverse section of still another surface mount connector and heater assembly of the present invention.

DESCRIPTION OF THE PREFERRED EMBODIMENTS

Figure 1:
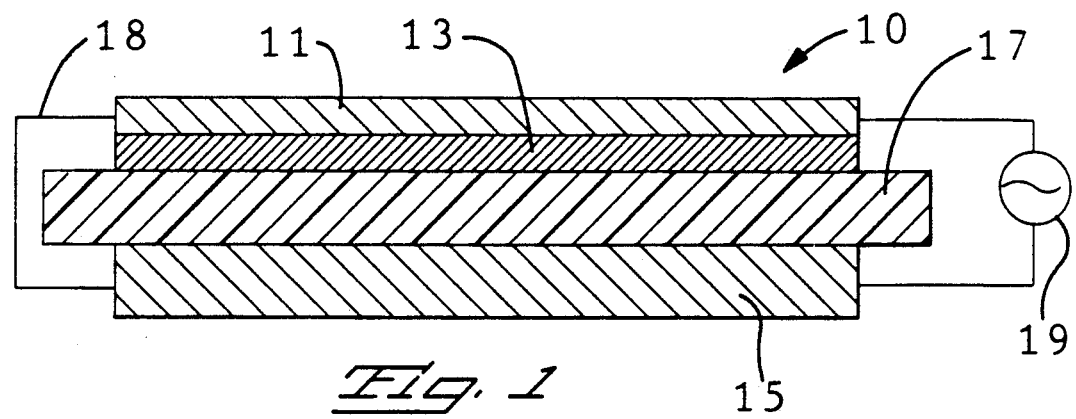
FIG. 1 is a view in longitudinal section of a self-regulating heater useful in various embodiments of the present invention.

Referring specifically to FIG. 1 of the accompanying drawings, there is illustrated a self-regulating heater 10 for use in soldering terminals of a surface mount connector to circuit board contact pads, or the like. The heater includes an elongated rectangular substrate 11 of copper, copper alloy, phosphor bronze, beryllium copper, brass or other material having a high electrical conductivity (i.e., low resistivity) and negligible magnetic permeability (i.e., a permeability of, or close to, one).

The substrate material must also be a good thermal conductor. Substrate 11 typically, although not necessarily, has a length much greater than its width which, in turn, is much greater than its thickness. As an example of these relative dimensions, the substrate length may be three inches, its width may range from one-tenth to one-half inch, and its thickness may range from 0.005 to 0.010 inch. It should be noted that the rectangular substrate configuration illustrated in FIG. 1 is merely an exemplary configuration and that substantially any configuration, consistent with the principles described herein, may be employed.

A thermally-conductive skin layer 13 of magnetic material is deposited or otherwise disposed over one surface of substrate 11. Typically a roll cladding process is used where the magnetic material layer is laid over the substrate then subjected to high pressure and temperature which diffuses the two materials together at the boundary layer, but other processes such as plating or sputter depositing could be used. In the illustrated embodiment surface layer 13 having a typical thickness of 0.002 inch is disposed over the entirety of that surface but may be disposed only on selected surface portions. A typical material for layer 13 is nickel, iron, or a nickel-iron alloy, such as Alloy 42 (forty-two percent nickel, fifty-eight percent iron), or Alloy 42-6 (forty-two percent nickel, six percent chromium, fifty-two percent iron); however, layer 13 may be any metal or alloy having the characteristics described herein. Depending upon the particular material, magnetic permeabilities for layer 13 range from fifty to more than one thousand, as compared to a permeability of one for copper; typical electrical resistivities for layer 13 range from twenty to ninety micro-ohms per centimeter as compared to 1.72 for copper. The thickness of surface layer 13 is typically one skin depth. In this regard, substrate 11 and layer 13, when energized by passing a constant amplitude alternating current therethrough, function as a self-regulating heater. Specifically, for temperatures below the Curie temperature of the material of surface layer 13, slightly more than sixty-three percent of the constant amplitude current flowing through the heater is concentrated in one skin depth from the heater surface. The skin depth is proportional to the square root of the material resistivity, and is inversely proportional to the square root of the product of the magnetic permeability of surface layer 13 and the frequency of the alternating current passing through the heater. At temperatures equal to or above the Curie temperature of the surface layer 13 material, the magnetic permeability of that material drops to approximately that of the substrate material (i.e., a permeability of one, for copper), thereby producing a dramatic increase in the surface depth. Consequently, much more of the constant amplitude current is distributed in the lower resistivity substrate 11 than in higher resistivity surface layer 13, with the result that considerably less heat is dissipated. Importantly, if selected locations of the heater body are in contact with thermal energy absorptive loads (e.g., heat sinks), then the temperature at those locations of the heater body does not rise as readily as it does at the non-load locations. It is possible, therefore, for the constant amplitude current to be concentrated in surface layer 13 to a greater extent at the load locations (where the temperature is below the Curie temperature for surface layer 13) than at the non-load locations (where the temperature is equal to the Curie temperature of surface layer material 13). Curie temperatures for materials can range from 50 degrees C. to 1,000 degrees C.; typical materials employed for surface layer 13 have Curie temperatures in the range of 200 degrees C. to 500 degrees C., depending on the solder or fusing material employed.

In order to actuate the heater, a tooling assembly is employed and comprises an electrically-conductive bus bar layer 15 and a superposed layer 17 of electrically insulative material. Bus bar layer 15 is typically copper and has length and width dimensions similar to those of substrate 11; the thickness typically differs. Insulative layer 17 is typically Kapton and is slightly larger in length and width than the corresponding substrate dimensions; the thickness of layer 17 is of the same order of magnitude as that of the substrate. The tooling assembly may be secured flush against heater body assembly 10, as illustrated in FIG. 1, with the exposed surface of the insulative layer 17 abutting surface layer 13. Under such circumstances the heater body and tooling assembly may be held together permanently by adhesive disposed between layers, or any other technique that joins the tooling to the heater body in flush abutting relation. Alternatively, the tooling assembly may be selectively movable into and out of flush contact with the heater body.

A source 19 of constant amplitude alternating current is connected across the heater body assembly (at substrate 11) and the tooling assembly (at bus bar layer 15) at one end of the heater assembly. Source 19 may be any suitable constant amplitude alternating current supply such as, for example, the source disclosed in U.S. Pat. No. 4,626,767 (Clappier et al) and provides a constant amplitude alternating signal, typically in the radio frequency range. Most commonly, the frequency of the actuating signal is 13.56 MHz. The constant amplitude of the signal is selected to provide the desired heating level. An impedance matching circuit is typically provided to match the impedance of the heater-tooling combination to the source impedance. At the end of the heater body located longitudinally remote from the connection to source 19 there is a wire 18 or other short circuit interconnecting substrate 11 and bus bar 15. Current flow through the combination, therefore, at any instant of time, is in longitudinally opposite directions in heater 10 (i.e., in substrate 11 and layer 13), and bus bar 15. A resulting electric field is established between heater 10 and bus bar 15 across insulation layer 17, thereby concentrating the current flowing through the heater assembly in the high resistance surface layer 13 rather than in the low resistance outer surface of substrate 11. The current flowing through bus bar layer 15 is concentrated at the surface facing the heater assembly 10. Since the current amplitude is maintained constant, it is desirable, for optimal heating, to concentrate the current in the high resistance surface layer 13 of heater assembly 10 rather than in the low resistance substrate 11. That is, the resistive heating, with the current maintained constant, is greater when the current path has greater resistance. The electric field developed by the oppositely-directed current flowing in the heater assembly and bus bar 15 assures that the current in the heater assembly is concentrated in the high resistance surface region of the heater assembly facing the bus bar.

As described below, and in greater detail in co-pending U.S. patent application Ser. No. 07/277,116, filed contemporaneously herewith by McKee et al and entitled "Self Regulating Temperature Heater With Thermally Conductive Extensions", a plurality of spaced terminals (not visible in FIG. 1) extend from heater body 10. The terminals are preferably formed integrally with the heater body and are thermally conductive so as to transfer thermal energy from the heater 10. In the embodiment illustrated in FIG. 1 the terminals extend into the plane of the drawing and are spaced along the horizontal dimension of the drawing. The thermal energy resulting from the resistive heating at heater 10 is conducted by the various terminals to connection sites in order to melt solder that is deposited in pre-determined amounts at those sites, typically on the contact pads of a circuit board. A typical solder is 63 percent tin with the balance being lead, having a melting point of 183 degrees C.

The nature of heater assembly 10 is such that the resistive heating is produced only where it is needed to effect the soldering operations. More specifically, current through heater assembly 10 flows longitudinally and thereby alternately encounters regions from which the terminals project and regions corresponding to spaces between the terminals. Thermal energy developed in regions proximate the terminals is conducted to respective connection sites by the terminals, thereby preventing the temperature at those regions from building up quickly. On the other hand, in the regions corresponding to spaces between terminals, the temperature increases rapidly until it reaches the Curie temperature of the material of the surface layer 13, whereupon the effective skin depth is increased dramatically in those regions. This results in more current flowing through the low resistance substrate material in these regions and, as a consequence, less thermal energy is produced therein. The regions proximate the terminals continue to develop high amounts of thermal energy that is conducted to respective connection sites. Overheating of the connection sites is prevented by the same mechanism; that is, once the temperature at the connection site reaches a certain level, thermal conduction from the heater to the site ceases, thereby removing the heat sink effect of the connection site. The thermal energy developed by the current flowing in high resistance layer 13 then quickly increases the temperature proximate the terminals until the Curie temperature of the material is reached. At this point the effective skin depth along the entire length of the heater assembly is increased so that more of the constant amplitude current flows through the low resistance substrate 11 and significantly less energy is produced by resistive heating. After current is removed from the heater assembly, the assembly begins to cool and the solder is permitted to solidify. The cooling proceeds quickly because the relatively low mass of the heater does not retain its heat for long periods of time.

Figure 2:
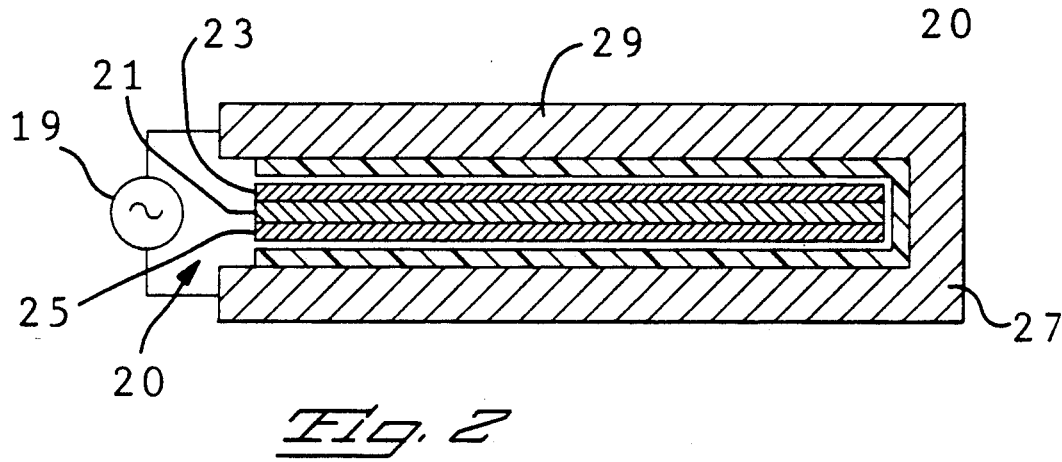
FIG. 2 is a view in longitudinal section of another self-regulating heater useful in various embodiments of the present invention.

An alternative self-regulating heater 20 is illustrated in FIG. 2 of the accompanying drawings and develops its heater current by means of electromagnetic induction rather than by direct conduction. The heater 20 takes the form of an elongated (i.e., in the horizontal dimension of the drawing) substrate 21 of copper, or the like, the opposite surfaces of which are coated with respective surface layers 23, 25 of magnetic alloy or similar metal. Heater 20 also has at least one row of terminals secured thereto (not visible in FIG. 2 but extending into the plane of the drawing) in the manner described above in relation to heater 10. The terminals are in thermally-conductive relation with the heater. A tooling member for applying current to heater 20 comprises a primary conductor 27 formed as an elongated strip of copper, or the like, bent in a U-shaped configuration. The inside surface of conductor 27 has a strip 29 of electrically-insulative material disposed thereon and extending over most of the length of the conductor. In use, heater 20 is disposed between the legs of the U-shaped primary conductor 27 and may either be spaced (as shown) by an air gap from the insulative strip 29, or may contact the insulative strip in flush abutting relation at each surface layer 23, 25. In either case, the heater 20 is typically held in place within primary conductor 27 by appropriate tooling attachments (not shown). For example, any suitable electrically-insulative bracket secured to strip 27 may be adapted to support heater 20 within the primary conductor confines.

In operation a source 19 of constant amplitude alternating current is connected across the distal ends of the U-shaped primary conductor 27. That conductor functions as a primary winding of a transformer to induce eddy currents in the heater strip 20 which serves as the secondary winding. The induced eddy currents, as is well-known, tend to flow in planes perpendicular to the magnetic flux developed by the primary current. The flux produced by the alternating primary current in conductor 27 is directed perpendicularly to the surfaces of heater 20; therefore, the induced eddy currents flow in planes parallel to the heater surface. The eddy currents are subject to the skin effect phenomenon and, therefore, concentrate in the high-resistance surface layers 23, 25 for temperatures below the Curie temperature of the skin layer material. The amplitude of the primary current is selected such that the resistive heating resulting from the eddy currents in the surface layers is sufficient to heat the terminals projecting from the heater 20 to the temperature required to melt solder deposited at the connection sites. After a soldering operation the terminals may be severed from the heater assembly in the manner described below.

Currents may also be electromagnetically induced in heater assembly 20 by means of a primary circuit comprising a number of turns of wire wrapped about the heater with insulation or an air gap interposed between the heater and the turns of wire. Electromagnetic induction of the heating current may also be effected by the transformer configuration described in U.S. Pat. No. 4,745,264 (Carter).

It is to be understood that the self-regulating heater embodiments 10, 20 described above are only examples of heaters that may be employed in connection with the present invention. For example, other suitable heaters are disclosed in co-pending U.S. patent application Ser. Nos.: 277,226, filed on Nov. 29, 1988 by McKee et al and entitled "Self Regulating Temperature Heater With Thermally Conductive Extensions"; 277,361, filed on Nov. 29, 1988 by McKee et al and entitled "Self Regulating Temperature Heater Carrier Strip"; 277,170, filed on Nov. 29, 1988 by McKee et al and entitled "Generating Electromagnetic Fields In A Self Regulating Temperature Heater By Positioning Of A Current Return Bus"; and 277,095, filed on Nov. 29, 1988 by McKee et al and entitled "Self Regulating Temperature Heater As An Integral Part Of A Printed Circuit Board"; all filed contemporaneously herewith and owned by the same assignee as the present patent application. The disclosure in all of these patent applications are expressly incorporated herein, in their entireties, by this reference.

Figure 3:
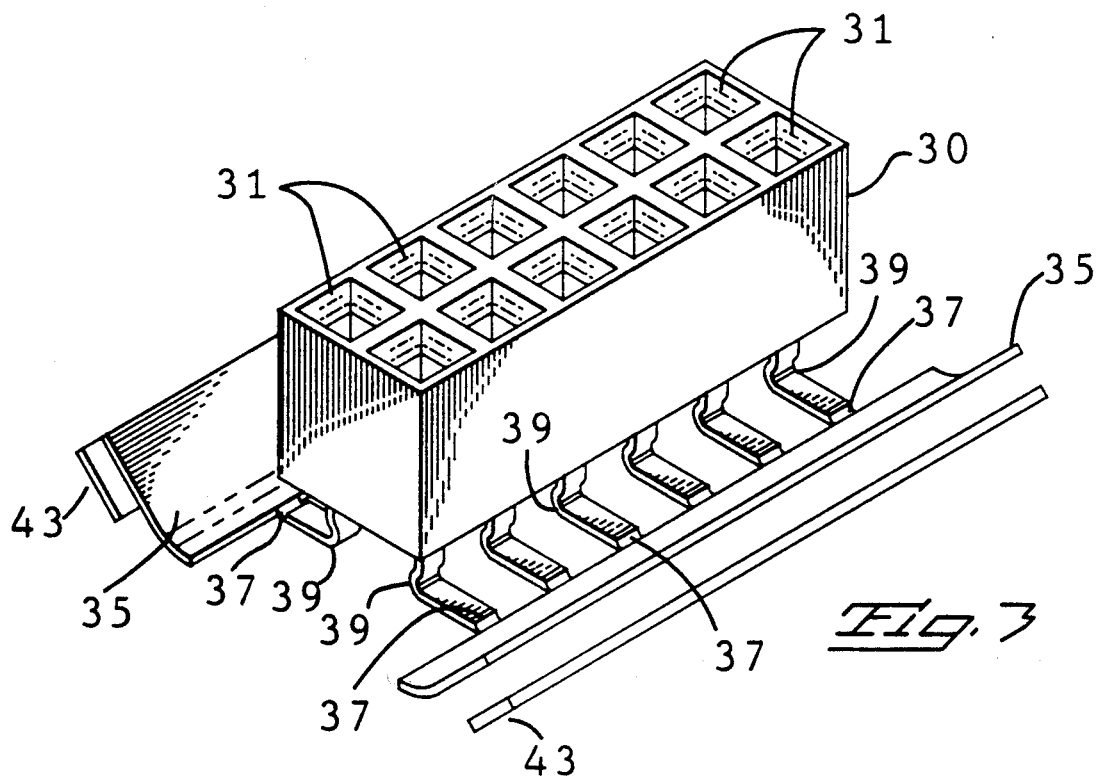
FIG. 3 is a view in perspective of a surface mount connector and heater assembly arranged in accordance with the principles of the present invention.

Referring to FIGS. 3 and 4 of the accompanying drawings, a surface mount connector 30 includes a housing in which a plurality of terminal-receiving passages 31 are defined. Each passage 31 is adapted to receive a respective terminal 33 through the underside of the housing in the manner described, for example, in U.S. Pat. No. 4,693,528 (Asick et al) or 4,645,287 (Olsson), the terminals 33 being of either the pin or socket type. In accordance with the present invention the terminals 33 are located at the distal ends of respective projections from one or more self-regulating heaters 35 of the type described above. The projections are typically copper or copper alloy and formed integrally with heaters 35. The proximal ends of the projections are joined to the heaters at transverse score lines 37 of reduced thickness to facilitate severing of the projections from the heaters after a soldering operation. Located intermediate terminals 33 and score lines 37 on each projection there is a solder tail portion 39 adapted to be placed in abutting relation against a respective contact pad 41 on a circuit board 40. The spacing between the terminal projections along the length of heaters 35 is chosen to assure that the solder tails 39 do, in fact, overlie respective contact pads 41.

An assembly comprising surface mount connector 30 and heater 35 with its projecting terminals may be assembled and stored until the connector is to be soldered to a circuit board 40. At that time the assembly is positioned on the circuit board with solder tails 39 resting on respective contact pads 41 to define respective connection sites. Solder or other fusible electrically-conductive material is typically pre-deposited in measured amounts on each contact pad 41, but may be pre-deposited on the solder tails or delivered to the connection site during the soldering procedure. Tooling 43, which may be permanently secured to the heater 35 or selectively brought into contact therewith, is utilized as described above to permit actuation of the heater via a source 19. The heater operates in the manner described above to conduct thermal energy to each solder tail 39 and contact pad 41 simultaneously to melt the solder. Once the solder has melted, the current is removed from the heater to permit the solder to harden, after which the heaters are removed from the terminals 33 along score lines 37.

For some applications the terminals are only partially inserted into respective passages 31 in the connector housing prior to soldering; once the solder connections have been made the terminals may be fully inserted into the passages, usually in a snap-fit engagement. Alternatively, the terminals may be fully inserted into the passages prior to the soldering operation.

As noted above, terminals 33 may be either pins or sockets. For certain types of terminals, particularly socket terminals it is desirable to utilize two juxtaposed heater elements with their projecting terminals interdigitated in the manner described in the aforementioned U.S. patent application Ser. No. 07/277,116. More particularly, and referring to FIG. 5 of the accompanying drawings, a terminal carrier strip is formed from two self-regulating heater sections 50, 51 positioned on opposite sides of a strip 56 of an insulation material such as Kapton. Heater section 50 includes an elongated generally rectangular substrate 52 of copper, copper alloy or other material having a high electrical conductivity and negligible magnetic permeability. A layer 53 of magnetic material is deposited or otherwise disposed over one surface of substrate 52. A plurality of electrical terminals 33 extend from one longitudinal edge of substrate 52 in spaced relation. As in the previously discussed embodiments, the terminals 33 are adapted to be received in appropriate terminal-receiving passages in a connector housing. The second heater section 51 is substantially identical to heater section 50 and includes substrate 54 with magnetic layer 55 disposed on one surface facing magnetic layer 53 of heater section 50. The insulation layer 56 is disposed between the two magnetic layers 53 and 55. A plurality of electrical terminals 33 also extend from substrate 54 in spaced relation. The edge of substrate 52 from which terminals 33 extend is aligned with the edge of substrate 54 from which its terminals extend, thereby positioning the two sets of terminals along the same edge of the overall carrier strip. The spacing between the terminals extending from substrate 52 is substantially the same as the spacing between the terminals extending from substrate 54 and is such the two sets of terminals are interdigitated. When performing a solder operation, a source of constant amplitude alternating current is typically connected between heater sections 50 and 51 at one longitudinal end of the assembly; a short circuit is typically connected between the two heater sections at the opposite end of the assembly. An electric field developed between the two heater sections across the insulation layer 56 concentrates the current flow in the two mutually-facing surfaces of the heater sections where the magnetic layers are disposed.

The embodiment illustrated in FIG. 6 includes an edge-type surface mount connector 60 adapted to be connected to arrays of contact pads 61, 63 disposed on opposite surfaces of a circuit board 65. One set of terminals 67 for connector 60 is secured to self-regulating heater 68 and is arranged to have the solder tails for those terminal contact respective contact pads 61; a second set of terminals 69 is secured to self-regulating heater 70 and is arranged to have the solder tails for those terminals simultaneously contact respective contact pads 63. By means of appropriate tooling the heaters 68 and 70 may be actuated with constant amplitude alternating current to effect the solder connections 72, 74 at the various connection sites in the manner described above.

As described above, the connection sites are most efficiently heated to the soldering temperature by automatic self-regulating heaters. It is to be understood, however, that the readily severable terminals may also be used in conjunction with other types of heaters, including nichrome wire and hot bar heaters.

For the embodiments illustrated in FIGS. 3, 4 and 5, two separate heater assemblies are described as being positioned on opposite sides of a surface mount connector being joined to a board. It will be appreciated by those skilled in the art that a single heater assembly configured lengthwise in the shape of a U can be similarly employed such that the two legs of the U correspond to the individual heaters described above.

Although solder is the preferred fusible electrically conductive material for most applications of the present invention, other such materials may be employed. For example, several conductive adhesives and pastes are commercially available and are fabricated as suspensions of metal powder in a thermosetting plastic. The metal powders employed are typically gold, silver, copper, aluminum etc., while the adhesive plastic is generally wa epoxy-type resin.

From the foregoing description it will be appreciated that the present invention makes available a novel method and apparatus for simultaneously joining plural terminals of a surface mount connector to respective contact pads on a printed circuit board, or the like, wherein only the two components to be joined at each connection site require alignment and wherein thermal energy is delivered only to the connection sites and not over a large area encompassing all of those sites.

Having described preferred embodiments of a new and improved method and apparatus for connecting a surface mount connector to a circuit board, or the like, it is believed that other modifications, variations and changes will be suggested to those skilled in the art in view of the teachings set forth herein. It is therefore to be understood that all such variations, modifications and changes are believed to fall within the scope of the present invention as defined by the appended claims.

We claim:

1. A method for providing electrically-conductive connections between terminals disposed in respective passages of a surface mount connector and respective contact pads on a surface, said method comprising:
   positioning solder tails of the terminals in adjacent abutting relation with respective contact pads to define respective connection sites;
   conducting thermal energy from a selectively actuable heater body to the contact pads via projecting members, secured to said heater body and including respective solder tails, to melt fusible electrically-conductive material at said connection sites;
   deactuating said heater body to permit the melted fusible material at each connection site to solidify; and
   severing said solder tails from said heater body.

2. The method according to claim 1 wherein said solder tails are only partially inserted within said respective passages prior to the step of positioning, and further comprising the step of:
   fully inserting said terminals in said respective passages after said step of deactuating and prior to said step of severing.

3. Apparatus for joining plural individual terminals of a surface mount connector to respective plural spaced contact pads on a circuit board surface by providing sufficient thermal energy to melt a fusible electrically conductive material at said contact pads, said apparatus comprising:
   a selectively actuable heater body for supplying at least said sufficient thermal energy;
   a plurality of mutually spaced thermally-conductive connecting members secured to and in thermally-conductive contact with said heater body, each of said connecting members having: a distal end in the form of a respective terminal of the mount surface connector, a proximal end secured to said heater body, an intermediate portion configured as a solder tail, and a structurally weakened portion disposed between said heater body and said solder tail to render the connecting members readily severable from said heater body once the solder tails have been joined to the contact pads, wherein each of said solder tails is adapted to be disposed in both electrical and thermal contact with a respective contact pad on the circuit board to transfer said sufficient thermal energy to said respective contact pad from said heater body and thereafter remain permanently connected to said respective contact pad.

4. An electrical connector for soldering to spaced contact pads on a circuit board by providing sufficient thermal energy to melt a fusible electrically conductive material at said contact pads, said electrical connector comprising:
   a selectively actuable heater for supplying at least said sufficient thermal energy;
   an insulative housing defining a base for engaging the circuit board, said housing having terminal receiving passages therein, said heater having a plurality of spaced thermally conductive members integral therewith, said thermally conductive members including terminals, said terminals having a portion disposed in respective terminal receiving passages, wherein each of said terminals is adapted to be disposed in both electrical and thermal contact with a respective contact pad on the circuit board to transfer said sufficient thermal energy to said respective contact pad from said heater.

5. An electrical connector as recited in claim 4 wherein the thermally conductive members include an intermediate portion between the heater and the portion disposed in terminal receiving passages, said intermediate portion including a structurally weakened section to render the terminals readily severable from the heater.

6. An electrical connector as recited in claim 4 wherein the spacing between said thermally conductive members corresponds to the spacing between said contact pads on a circuit board on which the connector is adapted to be mounted.

7. An electrical connector as recited in claim 4 wherein each of said contact pads has a prescribed amount of fusible material deposited thereon.

8. An electrical connector as recited in claim 4 wherein said heater comprises:
   a substrate of an electrically-conductive first material having a relatively low electrical resistivity and relatively low magnetic permeability, said substrate having a first surface;
   a skin layer of an electrically-conductive second material disposed on at least a portion of said first surface, said second material having a higher electrical resistivity than that of said first material, and having a magnetic permeability which at temperatures below its Curie temperature is substantially greater than said relatively low magnetic permeability and at temperatures above its Curie temperature is substantially the same as said relatively low magnetic permeability.

9. An electrical connector as recited in claim 8 wherein said thermally conductive members project from locations of said heater proximate said portion of said first surface.

10. An electrical connector as recited in claim 8 wherein said first material comprises copper.

11. An electrical connector as recited in claim 8 wherein said second material comprises iron.

12. An electrical connector as recited in claim 8 wherein said second material comprises nickel.

13. An article containing portions to be heated for joining plural individual terminals of a surface mount connector to respective plural spaced contact pads on a circuit board surface by delivery of sufficient thermal energy to melt a fusible electrically-conductive material at said contact pads, said article comprising:
   a selectively actuable heater body for supplying at least said sufficient thermal energy;
   a housing defining a base for engaging the circuit board, said housing having terminal receiving passages therein, said heater body having a plurality of spaced thermally-conductive connecting members integral therewith, each of said connecting members having a distal end in the form of a respective terminal of the surface mount connector, a proximal end secured to said heater body, and an intermediate portion configured as a solder tail, wherein each of said solder tails is adapted to be disposed in both electrical and thermal contact with a respective contact pad on the circuit board to transfer said sufficient thermal energy to said respective contact pad from said heater body;
   said heater body comprising a substrate of an electrically-conductive first material having a relatively low electrical resistivity and a relatively low magnetic permeability, said substrate having a first surface, said heater body also including a skin layer of an electrically-conductive second material disposed on at least a portion of said first surface, said second material having a higher electrical resistivity than that of said first material, and having a magnetic permeability which at temperatures below its Curie temperature is substantially greater than said relatively low magnetic permeability and at temperatures above its Curie temperature is substantially the same as said relatively low magnetic permeability;
   said apparatus further comprising tooling means for selectively causing alternative current to flow to said heater body at a substantially fixed amplitude sufficient to heat said skin layer to its Curie temperature within a prescribed time interval and at a frequency such that the current in the region of said portion of said first surface is concentrated in said skin layer.

14. An article as recited in claim 13 wherein said tooling means comprises a current return path and source means for selectively passing said alternating current through said heater body and said current return path.

15. An article as recited in claim 13 wherein said current return path includes a return bus and electrically-conductive means connecting said heater body to said return bus, said apparatus further comprising a layer of electrically-insulative material disposed between and in flush abutting contact with said skin layer and said return bus.

16. An article as recited in claim 15 wherein said return bus and said skin layer are permanently affixed to the heater body with said layer of insulative material flush against said skin layer.

17. An article as recited in claim 15 wherein said return bus and said layer of insulative material are selectively moveable into and out of contact with said heater body.

18. The apparatus according to claim 13 wherein said substrate includes a second surface opposite said first surface, said heater body further comprising a second skin layer of said electrically-conductive second material disposed on at least a portion of said second surface.

19. The apparatus according to claim 13 wherein said tooling means includes means for magnetically inducing said alternating current as eddy currents in said heater body.

20. The apparatus according to claim 13 wherein said current return path includes:

a second heater body comprising:
 a second substrate of electrically-conductive first material, said second substrate having a first surface;
 a second skin layer of said second material disposed on at least a portion of the first surface of said second substrate; and
 electrically-conductive means connecting the first and second heater bodies in series;
said apparatus further comprising a layer of electrically-insulative material disposed between and in flush abutting contact with said first and second skin layers.

* * * * *